(12) United States Patent
Tiemeijer (10) Patent No.: US 7,671,714 B2
(45) Date of Patent: Mar. 2, 2010

(54) PLANAR INDUCTIVE COMPONENT AND A PLANAR TRANSFORMER

(75) Inventor: Lukas Frederik Tiemeijer, Eindhoven (NL)

(73) Assignee: NXP B.V., Eindhoven (NL)

( * ) Notice: Subject to any disclaimer, the term of this patent is extended or adjusted under 35 U.S.C. 154(b) by 1250 days.

(21) Appl. No.: 10/485,906

(22) PCT Filed: Aug. 7, 2002

(86) PCT No.: PCT/IB02/03282

§ 371 (c)(1),
(2), (4) Date: Feb. 4, 2004

(87) PCT Pub. No.: WO03/015110

PCT Pub. Date: Feb. 20, 2003

(65) Prior Publication Data

US 2004/0240126 A1 Dec. 2, 2004

(30) Foreign Application Priority Data

Aug. 9, 2001 (EP) .................................. 01203050

(51) Int. Cl.
*H01F 5/00* (2006.01)
(52) U.S. Cl. ...................................................... 336/200
(58) Field of Classification Search .................. 336/200
See application file for complete search history.

(56) References Cited

U.S. PATENT DOCUMENTS 4,816,784 A * 3/1989 Rabjohn .................... 333/24 R
5,610,433 A * 3/1997 Merrill et al. ............... 257/531

(Continued)

FOREIGN PATENT DOCUMENTS

JP 2000357774 A * 12/2000

OTHER PUBLICATIONS

W.B. Kihn, N. M. Ibrahim, "Analysis of current crowding effects in multiturn spiral inductors", IEEE Trans. MTT, vol. 49, No. 1, pp. 31-38, 2001).

*Primary Examiner*—Elvin G Enad
*Assistant Examiner*—Joselito Baisa (57) ABSTRACT

The invention relates to a planar inductive component (11) comprising at least a first and a second concentric inductor, which include a first and a second spiral pattern (12A, 12B), respectively. Both spiral patterns have a first end point (13A, 13B) and a second end point (14A, 14B), are electrically interconnected, interlaced, and interrupted at the outer side, and provided with two contacts (16A, 16B) on one side of the opening (15A, 15B) and two contacts (17A, 17B) on the other side of the opening (15A, 15B). By interconnecting the first two contacts (16A, 16B) and the second two contacts (17A, 17B), respectively, both spiral patterns are connected in parallel. The spiral patterns (12A, 12B), which are magnetically coupled, have identical electrical and magnetic properties. This leads to a reduction of eddy current losses at high frequencies. This results in a planar inductive component (11) which is suitable for high-frequency operation with a high maximum quality factor Q. The invention also relates to a planar transformer comprising two planar inductive components according to the invention. The first planar inductive component serves as the first winding of the planar transformer; the second planar inductive component serves as the second winding of the planar transformer. As a result of the above-mentioned reduction in eddy current losses at high frequencies, the planar transformer can suitable be used for high-frequency operation.

15 Claims, 11 Drawing Sheets

U.S. PATENT DOCUMENTS

| | | | | |
|---|---|---|---|---|
| 5,874,704 A * | 2/1999 | Gates | | 219/121.43 |
| 5,966,063 A | 10/1999 | Sato et al. | | 336/200 |
| 6,476,704 B2 * | 11/2002 | Goff | | 336/200 |
| 6,794,977 B2 * | 9/2004 | Christensen | | 336/200 |
| 2003/0001709 A1 * | 1/2003 | Visser | | 336/200 |

* cited by examiner

PLANAR INDUCTIVE COMPONENT AND A PLANAR TRANSFORMER

The invention relates to a planar inductive component comprising at least a first and a second concentric planar inductor, which include, respectively, a first electroconductive spiral pattern and a second electroconductive spiral pattern, the first electroconductive spiral pattern having a first end point and a second end point, and the second electroconductive spiral pattern having a first end point and a second end point.

The invention also relates to a planar transformer comprising a first such planar inductive component and a second such planar inductive component.

In the course of time, integration in electronics has increased substantially, enabling more and more functions to be integrated in an ever decreasing volume. This integration has also been made possible by the advances made in the field of, for example, assembly techniques and IC technology. The advances made in the field of IC technology in combination with the demand for electronic products in the field of communication, for example in the field of mobile telephones, have led to integrated RF circuits (radio frequency circuits) wherein planar inductive components, such as inductors and transformers, are used. The frequency bands used in, for example, mobile telephony, such as the 900 MHz and the 1800 MHz bands, enable these planar inductive components to be readily and reproducibly manufactured in existing technologies together with other components on one integrated circuit.

A problem with such planar inductive components is the reduction of the ohmic losses to a minimum. At high frequencies, the ohmic losses increase rapidly, while the (self-)inductance hardly changes. This means, for example, that it is difficult to make good planar inductors for RF applications. In general, a good inductor is defined as an inductor having a quality factor above 10. This means that the ratio between the imaginary part of the impedance and the real part of the impedance is equal to or larger than 10. Customarily, a planar inductor comprises an electric conductor extending in accordance with a spiral pattern.

From the existing literature it is known that at frequencies in the range between 1 and 2 GHz, the inhomogeneous current distribution in a planar magnetic inductor contributes substantially to the ohmic losses (reference is made to, for example, W. B. Kuhn, N. M. Ibrahim, "Analysis of current crowding effects in multiturn spiral inductors", *IEEE Trans. MTT*, Vol. 49, No. 1, pp. 31-38, 2001). The electrical behavior of such an inductor can be represented essentially by means of a series arrangement of a self-inductance $L_S$ and a resistor $R_S$. In this series arrangement, $L_S$ represents the inductance of the spiral pattern and $R_S$ represents the ohmic losses that occur in the spiral pattern. As regards the above-mentioned frequency range, the ohmic losses are determined substantially by eddy current losses caused by the skin effect, and eddy current losses resulting from the mutual influence of the juxtaposed turns in the spiral pattern.

In U.S. Pat. No. 5,966,063 a solution is proposed to limit eddy current losses in a planar inductive component. The basic embodiment of the solution proposed is comprised of a planar inductive component having an electric conductor extending in accordance with a spiral pattern, which conductor is divided in the longitudinal direction into at least two parts. As a result, the planar inductive components disclosed in U.S. Pat. No. 5,966,063 is comprised of at least two interleaved spiral patterns. The innermost spiral pattern has a smaller length and a smaller surface area than the outermost spiral pattern. As a result, the electrical and magnetic behavior of both spiral patterns are different. Consequently, the solution described in U.S. Pat. No. 5,966,063 only partly solves the problem of ohmic losses caused by eddy currents.

It is an object of the invention to provide a planar inductive component whose ohmic losses caused by eddy currents are low. This object is achieved by means of a planar inductive component in accordance with the invention, characterized in that the first electroconductive spiral pattern that belongs to the first concentric inductor, and the second electroconductive spiral pattern that belongs to the second concentric inductor are interlaced;

the first end point and the second end point of the first electroconductive spiral pattern are electroconductively interconnected, and the first electroconductive spiral pattern is interrupted at the outside so as to form a first electroconductive contact and a second electroconductive contact on either side of the interruption;

the first end point and the second end point of the second electroconductive spiral pattern are electroconductively interconnected, and the second electroconductive spiral pattern is interrupted at the outside so as to form a first electroconductive contact and a second electroconductive contact on either side of the interruption.

The first and the second planar inductor both comprise a spiral pattern and are concentric. This means that they have a common imaginary center.

The first electroconductive spiral pattern that belongs to the first concentric inductor, and the second electroconductive spiral pattern that belongs to the second concentric planar inductor are interlaced. This means that moving from the imaginary center in a straight line towards the periphery the first inductor and the second inductor always alternate with each other.

The first and the second electroconductive spiral pattern each have a first and a second end point. The first end point is the end point closest to the imaginary center, the second end point is the end point that is farthest removed from the imaginary center.

The spiral pattern of the first and the second concentric planar inductor is interrupted at the outside. "Interrupted at the outside" means that the interruption can be approached by moving in a straight line from a point situated outside the spiral pattern, yet in the plane wherein the spiral pattern is situated, towards the imaginary center.

The spiral pattern of the first and the second concentric planar inductor is provided with a first electroconductive contact on one side of the interruption, and with a second electroconductive contact on the other side of the interruption. The current path between the first and the second electroconductive contact will thus comprise the entire length of the spiral pattern of either the first or the second concentric planar inductor.

The advantage of the spiral patterns designed as described above resides in that these spiral patterns have the same magnetic and electrical properties.

As a result, the current distribution is homogeneous. This results in low ohmic losses.

A further advantage of the use of a spiral pattern resides in that it enables the highest possible (self-)inductance to be realized on the smallest possible surface area.

Although the planar inductive component in accordance with the invention is excellently suited for use within integrated circuits operating at high frequencies, such as RF circuits on, for example, a silicon substrate, the application is not limited thereto. Other possible applications are, for example, in the field of switch-mode power supplies. In the frequency range associated with these switch-mode power supplies, it is favorable to realize such planar inductive components on, for example, ceramic substrates by means of thin-film or thick-film techniques. Such planar inductive components can alternatively be realized as part of a circuit on a PCB (printed circuit board), in which case the spiral patterns are formed by, for example, copper tracks.

It may also be favorable to provide the planar inductive component with an envelope of a magnetic material to further improve the magnetic properties, provided that this is compatible with the technology used.

In addition, it may be possible that the design rules employed in a certain technology limit the designer to the use of patterns that include angles of, for example, 45 or 90 degrees with each other. In such cases, the spiral pattern may be rectangular or octagonal in appearance.

An additional advantage of the planar inductive component in accordance with the invention resides in that it can be used as a basic element in an assembly of planar inductive components. Such an assembly comprises a plurality of planar inductive components in accordance with the invention that are arranged in the flat plane. By electroconductively interconnecting said planar inductive components, a new, composite, planar inductive component is obtained whose electrical and magnetic properties can be accurately predetermined by means of the electrical and magnetic properties of a single planar magnetic component.

An embodiment of the planar inductive component in accordance with the invention is characterized in that the planar inductors each comprise at least a first electroconductive spiral pattern and a second electroconductive spiral pattern which are separated from each other by an electrically insulating layer. By using a plurality of electroconductive spiral patterns, a limitation of the necessary surface of the planar inductive component is achieved.

A further embodiment of the planar inductive component in accordance with the invention is characterized in that at least the first electroconductive spiral pattern and the second electroconductive spiral pattern are electroconductively interconnected by vias. By electrically interconnecting a plurality of electroconductive spiral patterns an increase of the effective section of the spiral patterns is achieved. This has the advantage that a smaller series resistance in combination with an unchanged (self-)inductance is achieved.

A further embodiment of the planar inductive component in accordance with the invention is characterized in that the first electroconductive contact of the first electroconductive spiral pattern is electroconductively connected to the first electroconductive contact of the second electroconductive spiral pattern, and the second electroconductive contact of the first electroconductive spiral pattern is electroconductively connected to the second electroconductive contact of the second electroconductive spiral pattern so as to form a system of electrically interconnected inductors having identical electrical and magnetic properties. In this manner, an inductor is achieved that is divided into a number of parallel current paths which are identical in terms of their electrical and magnetic properties. As a result, also at high frequencies, the current is equally distributed over the current paths. This has the advantage that the inductor has good high-frequency properties. This means that an inductor realized in this manner can have a quality factor above 10.

In the foregoing, the discussion focused mainly on planar inductors. Planar transformers have the same problems as planar inductors. In known planar transformers, the ohmic losses caused by eddy currents in the windings increase substantially as the frequency increases. These ohmic losses also limit the practical uses of known planar transformers at high frequencies.

The invention also aims at providing a planar transformer having low ohmic losses. The planar transformer in accordance with the invention comprises a first planar inductive component in accordance with the invention and a second inductive component in accordance with the invention, wherein the first planar inductive component and the further planar inductive component are separated by means of an electrically insulating layer, and wherein the first planar inductive component forms a first winding of the transformer and the second planar inductive component forms a second winding of the transformer. A planar transformer thus realized has the advantage that in the first winding and in the second winding the current is equally distributed over the spiral patterns of the concentric planar inductors of the first planar inductive component and also equally distributed over the spiral patterns of the concentric inductors of the second planar inductive component. This results in low ohmic losses at high frequencies. As a result, a good planar transformer suitable for operation at high frequencies is achieved in this manner.

The planar transformer in accordance with the invention cannot only be used inside integrated circuits operating at high frequencies. It can also be used, for example, in the field of switched-mode power supplies. In the frequency range associated with said switch-mode power supplies, such planar transformers are favorably realized, for example, on ceramic substrates by means of thin-film or thick-film techniques. Such planar transformers can alternatively be realized as a part of a circuit on a PCB, in which case the spiral patterns are formed by, for example, copper tracks.

It may also be favorable to provide the planar transformer with an envelope of a magnetic material in order to improve the magnetic properties, provided that this is compatible with the technology used.

These and other aspects of the invention are apparent from and will be elucidated with reference to the embodiments described hereinafter.

In the drawings.

In these Figures, like reference numerals refer to like parts.

Figure 1A:
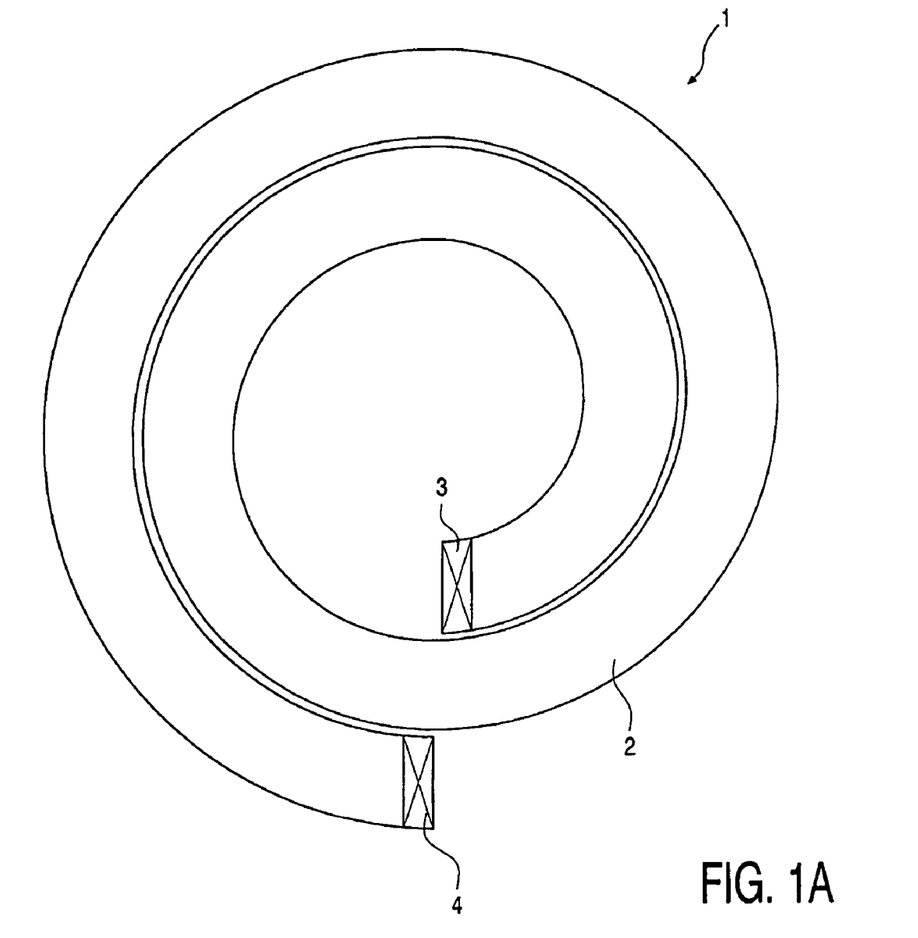
FIG. 1A diagrammatically shows an embodiment of a planar inductor in accordance with the prior art.

FIG. 1A diagrammatically shows an embodiment of a planar inductor 1 in accordance with the state of the art. In this embodiment, the planar inductor 1 is comprised of a spiral pattern 2 of electroconductive material that is provided on an electrically insulating layer of a base material or substrate. The spiral pattern 2 has a first end point 3 that is closest to the imaginary center of the spiral pattern 2, and a second end point 4 that is farthest removed from the imaginary center of the spiral pattern 2. At the location of the first end point 3 and the second end point 4, the planar inductor 1 is brought into electroconductive contact with further components of the circuit that comprises the planar inductor 1.

Figure 1B:
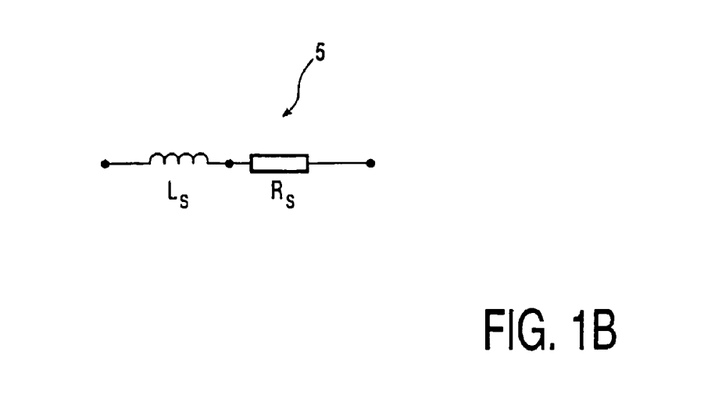
FIG. 1B shows an electrical equivalent-circuit diagram of the embodiment of the planar inductor shown in FIG. 1A.

FIG. 1B shows an electrical equivalent-circuit diagram 5 of the embodiment of the planar inductor 1 shown in FIG. 1A. Said electrical equivalent-circuit diagram 5 is a one-gate element comprised of a self-inductance $L_S$ that is arranged in series with a resistor $R_S$. $L_S$ represents the self-inductance of the spiral pattern and $R_S$ represents the ohmic losses that occur in the spiral pattern. The resistance characteristic of $R_S$ is frequency-dependent. It is known from the existing literature that at frequencies in the range between 1 and 2 GHz, the inhomogeneous current distribution in a planar magnetic inductor contributes substantially to the ohmic losses (reference is made to, for example, W. B. Kuhn, N. M. Ibrahim, "Analysis of current crowding effects in multiturn spiral inductors", *IEEE Trans. MTT*, Vol. 49, No. 1, pp. 31-38, 2001). In this frequency range, the ohmic losses are mainly determined by eddy current losses caused by the skin effect and eddy current losses caused by the mutual influence of the juxtaposed turns in the spiral pattern.

Figure 2A:
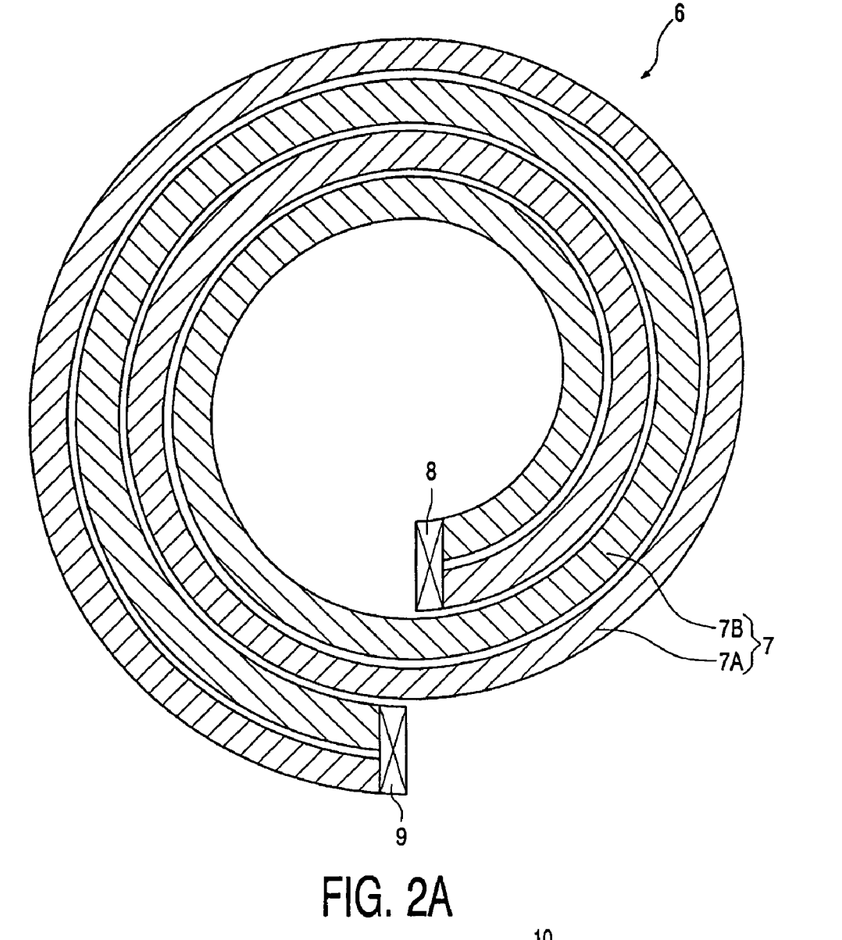
FIG. 2A diagrammatically shows a different embodiment of a planar inductor in accordance with the state of the art.

FIG. 2A diagrammatically shows a different embodiment of a planar inductor 6 in accordance with the state of the art. This embodiment relates to the solution proposed in U.S. Pat. No. 5,966,063 to reduce ohmic losses caused by eddy currents. The planar inductor 6 in this embodiment consists of a spiral pattern 7 of electroconductive material that is provided on an electrically insulating substrate. The spiral pattern 7 is divided in the longitudinal direction into a first outside portion 7A and a second inside portion 7B. Both portions 7A and 7B of the spiral pattern 7 are concentric and have a common first end point 8 that is situated closest to the imaginary center of the spiral pattern 7 and a second common end point 9 that is farthest removed from the imaginary center of the spiral pattern 7. The inside portion 7B of the spiral pattern 7 has a smaller length and a smaller surface area than the outside portion 7A. The term concentric is to be taken to mean that both spiral patterns 7A and 7B have a common imaginary center.

Figure 2B:
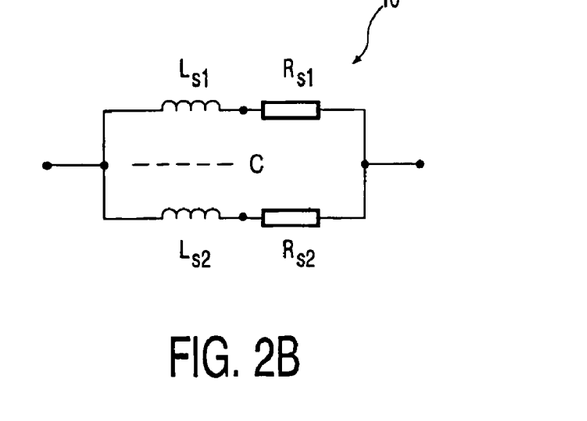
FIG. 2B shows an electrical equivalent-circuit diagram of the embodiment of the planar inductor shown in FIG. 2A.

FIG. 2B shows an electrical equivalent-circuit diagram 10 of the embodiment of the planar inductor shown in FIG. 2A. Said electrical equivalent-circuit diagram 10 is a one-gate element comprising two parallel branches. The first parallel branch comprises a first self-inductance $L_{S1}$ that is arranged in series with a resistor $R_{S1}$. The second parallel branch comprises a second self-inductance $L_{S2}$ that is arranged in series with a resistor $R_{S2}$. The first parallel branch represents the electrical and magnetic behavior of the outside portion 7A of the spiral pattern 7 shown in FIG. 2A. The second parallel branch represents the electrical and magnetic behavior of the inside portion 7B of the spiral pattern 7 shown in FIG. 2A. As both portions 7A and 7B of the spiral pattern 7 are closely spaced, they influence one another. This magnetic coupling is represented by means of the coupling c between $L_{S1}$ and $L_{S2}$ in the electrical equivalent-circuit diagram 5.

At low frequencies, the ratio between the currents in both branches is determined by the ratio between the resistors $R_{S1}$ and $R_{S2}$. If there was no coupling c between the two inductors, then, at high frequencies, the ratio between currents through the inductors would be determined by the ratio between the self-inductances $L_{S1}$ and $L_{S2}$. In the planar inductor 6, as shown in FIG. 2A, there is a significant coupling between $L_{S1}$ and $L_{S2}$, i.e. c≈1. If $R_{S1}$ and $R_{S2}$ are equal, it can be derived that, at high frequencies and differences between $L_{S1}$ and $L_{S2}$ that are not too large, the actual part of the total impedance Z can roughly be given by the following relation:

$$\frac{\text{Re}(Z)}{R} \approx \frac{1}{2} + \frac{1}{2} \cdot \frac{1}{(1-c)^2} \cdot \frac{(L_{S1}-L_{S2})^2}{(L_{S1}+L_{S2})^2}$$

If the difference between $L_{S1}$ and $L_{S2}$ is larger and meets the following relation $$\frac{|L_{S1}-L_{S2}|}{L_{S1}+L_{S2}} \geq 1-c$$

the magnetic coupling will lead, at high frequencies, to a current reversal in the spiral pattern having the largest self-inductance.

The above-described behavior plays an important part in the planar inductor 6 if the width of the spiral patterns 7A and 7B amounts to 2 to 10% of the overall diameter of the inductor 6. Calculations have shown that the current in the spiral pattern 7B is subject to a smaller self-inductance than the current in spiral pattern 7A. It can also be demonstrated that the current at the edges of the spiral patterns 7A and 7B is subject to a lower self-inductance than the current in and near the center of the conductor.

In these cases, there is a strong coupling between the current paths. Dependent upon the width of the spiral patterns 7A and 7B, a substantial increase of the real part of the impedance of the planar inductor 6 may occur. A reduction of the differences in self-inductance between the spiral patterns 7A and 7B by reducing the width of the spiral patterns however leads to an increase of the resistance at low frequencies and, consequently, is not a satisfactory solution as it leads to a reduction of the quality factor Q.

Figure 3A:
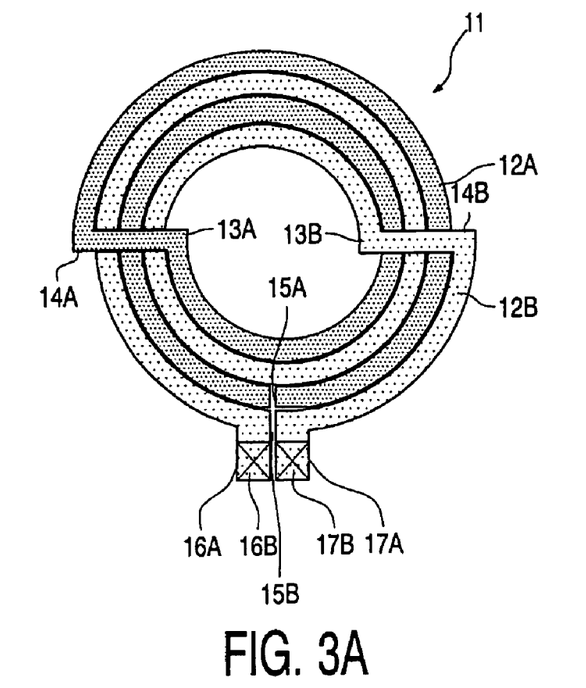
FIG. 3A diagrammatically shows an embodiment of a planar inductive component in accordance with the invention.

FIG. 3A diagrammatically shows an embodiment of a planar inductive component in accordance with the invention.

Like the known planar inductor 6 described with reference to FIG. 2A, this embodiment of the planar inductive component 11 in accordance with the invention comprises two concentric inductors. Both concentric inductors comprise spiral patterns, a first spiral pattern 12A belonging to a first concentric inductor, and a second spiral pattern 12B belonging to a second concentric inductor. The spiral patterns 12A and 12B are made of electrically conductive material, and they comprise, respectively, first end points 13A and 13B and second end points 14A and 14B, and they are provided on an electrically insulating substrate. An important difference between the known planar inductor 6 and the inductive component 11 resides in that the spiral patterns 12A and 12B are interlaced. This means that moving from the imaginary center in a straight line towards the periphery, the first spiral pattern 12A and the second spiral pattern 12B always alternate with each other. Furthermore, in each of the spiral patterns 12A, 12B, the first end point 13A, 13B is electroconductively connected to the second end point 14A, 14B. Also each of the spiral patterns 12A, 12B is interrupted at its outside. This interruption serves to form a first electroconductive contact 16A, 16B, respectively, on one side of the interruption 15A, 15B, respectively, and a second electroconductive contact 17A, 17B, respectively, on the other side of the interruption 15A, 15B, respectively. In FIG. 3A, the first conductive contact 16A and the second conductive contact 17A of the spiral pattern 12A are situated below the first conductive contact 16B and the second conductive contact 17B of the spiral pattern 17B. The current path between the first electroconductive contact 16A, 16B and the second electroconductive contact 17A, 17B, respectively, will consequently comprise the entire length of the spiral pattern 12A or 12B of, respectively, the first or the second concentric planar inductor. As a result, the electrical and magnetic properties of both concentric inductors of the inductive component 11 in accordance with the invention are identical.

Figure 3B:
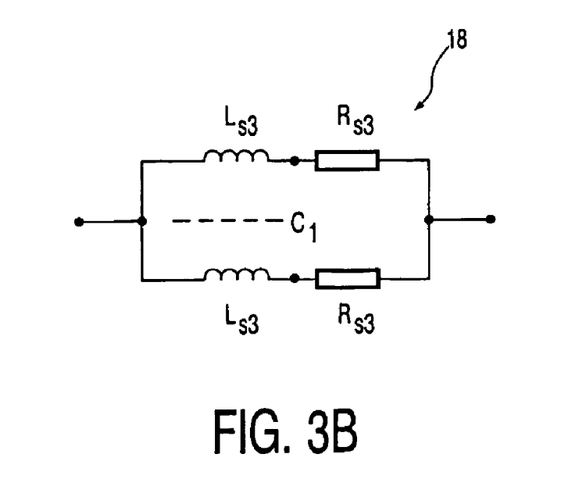
FIG. 3B shows an electrical equivalent-circuit diagram of the embodiment of the planar inductive component shown in FIG. 3A.

FIG. 3B shows an electrical equivalent-circuit diagram 18 of the embodiment of the planar inductive component shown in FIG. 3A. In the embodiment shown in FIG. 3A, the first electroconductive contact 16A of the spiral pattern 12A is electroconductively connected to the first electroconductive contact 16B of the spiral pattern 12B. In addition, the second electroconductive contact 17A of the spiral pattern 12A is electroconductively connected to the second electroconductive contact 17B of the spiral pattern 12B. In this manner, both concentric inductors of the inductive component are parallel-connected.

The electrical equivalent-circuit diagram 18 is a one-gate element comprising two identical parallel branches. As discussed hereinabove, both spiral patterns 12A and 12B shown in FIG. 3A are identical in terms of their electrical and magnetic behavior. Both parallel branches of the electrical equivalent-circuit diagram 18 comprise a self-inductance $L_{S3}$ arranged in series with a resistor $R_{S3}$. Each of the parallel branches represents the electrical and magnetic behavior of one of the spiral patterns 12A and 12B shown in FIG. 3A. As both spiral patterns 12A and 12B are closely spaced, they influence one another. This magnetic coupling is shown in the electrical equivalent-circuit diagram 18 by means of the coupling $c_1$ between the two self-inductances $L_{S3}$.

Figure 4:
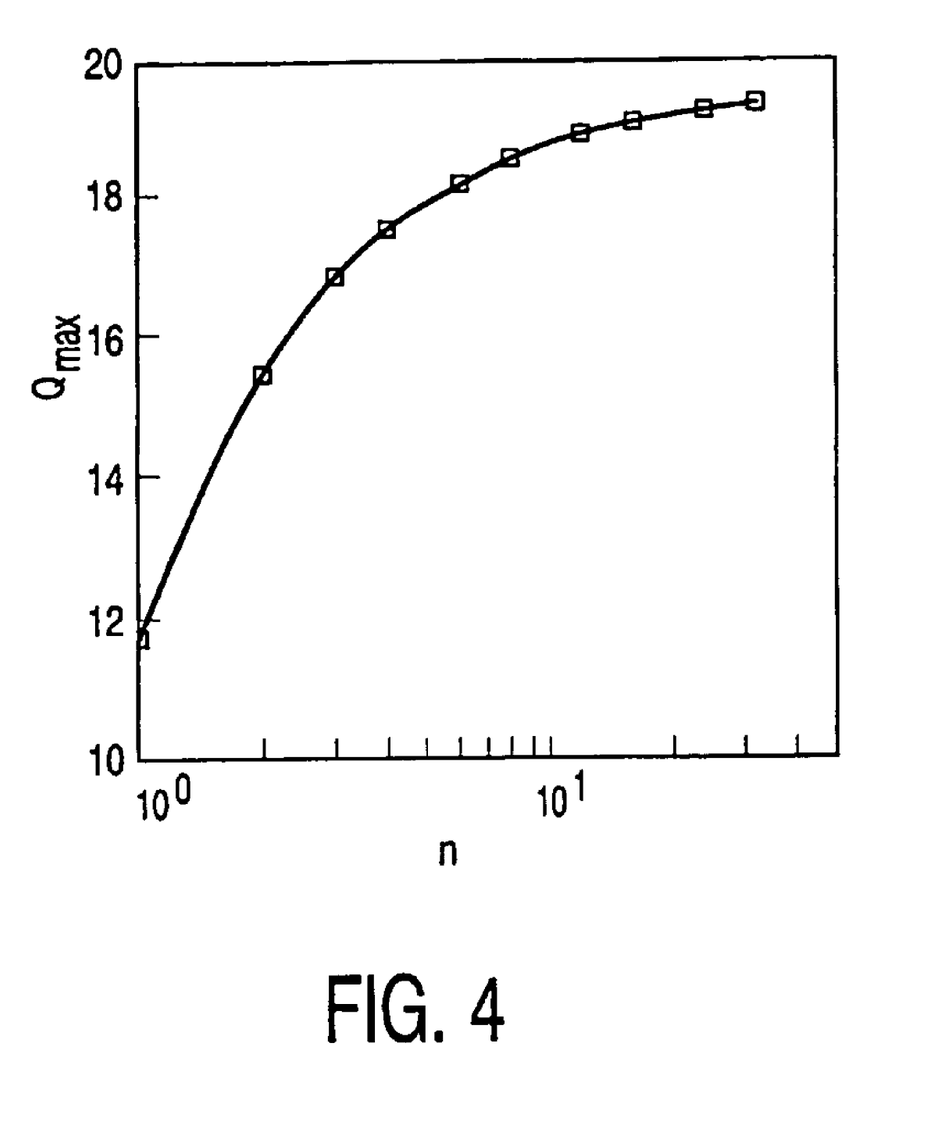
FIG. 4 shows a graph wherein the improvement of the quality factor calculated for an embodiment of the planar inductive component in accordance with the invention is shown.

FIG. 4 graphically shows the improvement of the quality factor Q that is calculated for an embodiment of the planar inductive component in accordance with the invention, in this case a planar inductor. Said planar inductor has a self-inductance of 4 nH and a diameter of 300 μm. On a semi-logarithmic scale, n is plotted along the horizontal axis, n being the number of parallel arranged, interlaced concentric inductors from which the planar inductive component is built up, and the maximum attainable quality factor, $Q_{max}$, is plotted along the vertical axis. The graph shows that a significant improvement of $Q_{max}$ is obtained if n, i.e. the number of spiral patterns 12, is increased. At n=1, $Q_{max}$ is 11.6, at n=32, $Q_{max}$ has increased to 19.4. The graph of FIG. 4 also shows that the greatest improvement is attained in the step from n=1 to n=2, which is a clear illustration of the favorable effect of the invention.

Figure 5A:
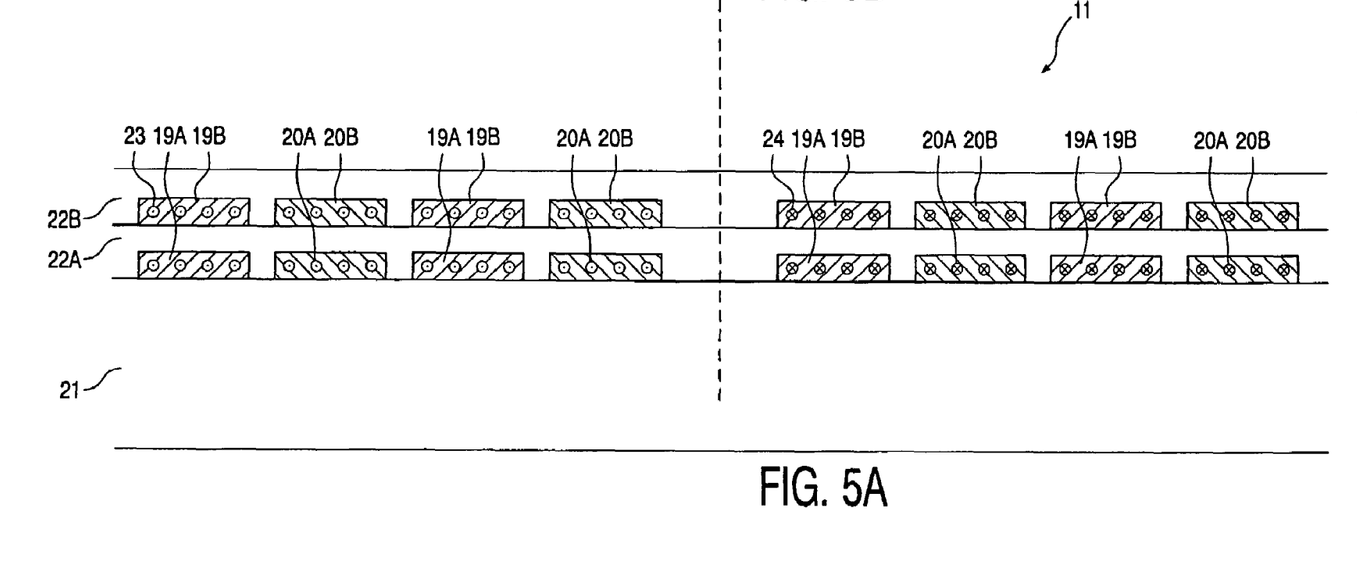
FIG. 5A is a diagrammatic cross-sectional view of an embodiment of the planar inductive component in accordance with the invention.

FIG. 5A is a diagrammatic cross-sectional view of an embodiment of the planar inductive component 11 in accordance with the invention. This embodiment comprises a first and a second concentric, interlaced, planar inductor. The first concentric planar inductor comprises a first spiral pattern 19A and a second spiral pattern 19B. The second planar inductor comprises a first spiral pattern 20A and a second spiral pattern 20B. The spiral patterns 19A, 19B, 20A, 20B are made of an electroconductive material. The first spiral patterns 19A, 20A are provided on the substrate 21. The first spiral patterns 19A, 20A and the second spiral patterns 19B, 20B are separated from each other by a first electrically insulating layer 22A. In addition, a second electrically insulating layer 22B is shown that is provided over the second spiral patterns 19B, 20B. The circles 23 and 24 indicate the current directions. The current direction is perpendicular to the cross-section. The circles 23 having a dot in the center indicate that the current flows towards the reader. The circles 24 having a cross in the center indicate that the current flows away from the reader. By using the first spiral patterns 19A, 20A and the second spiral patterns 19B, 20B, a limitation of the necessary surface area of the planar inductive component 11 is attained. This embodiment is particularly suitable for use in integrated circuits.

Figure 5B:
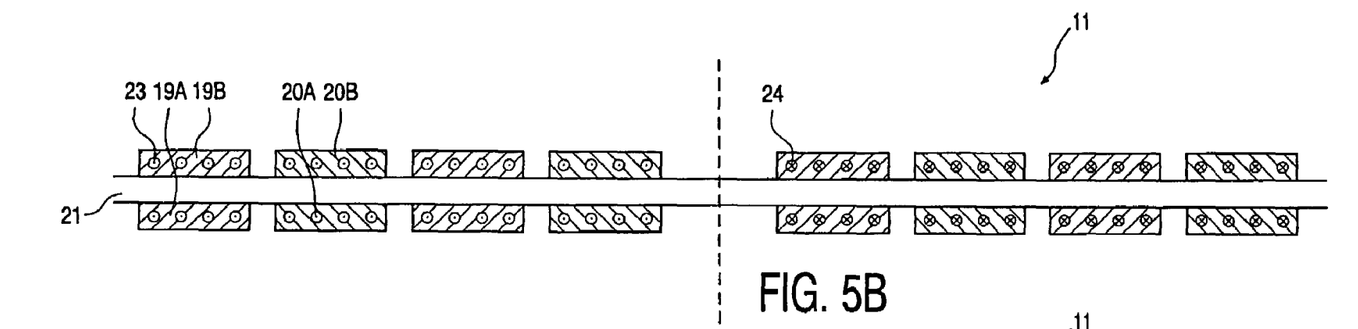
FIG. 5B is a diagrammatic cross-sectional view of a further embodiment of the planar inductive component in accordance with the invention.

FIG. 5B is a diagrammatic cross-sectional view of a further embodiment of the planar inductive component 11 in accordance with the invention. This embodiment is comparable to the embodiment shown in FIG. 5A. As in the embodiment shown in FIG. 5A, the concentric, interlaced planar inductors comprise the first spiral pattern 19A, 20A and the second spiral pattern 19B, 20B. This embodiment is very suitable for use in thin-film or thick-film technologies with, for example, a ceramic substrate on either side of which electroconductive thin-film materials or thick-film materials are provided. This embodiment is also excellently suited for use on printed circuit boards on either side of which electroconductive layers of, for example, copper are provided. The difference relative to the embodiment shown in FIG. 5A resides in that the substrate 21 does not only serve as a support but also as an electrically insulating layer.

Figure 6A:
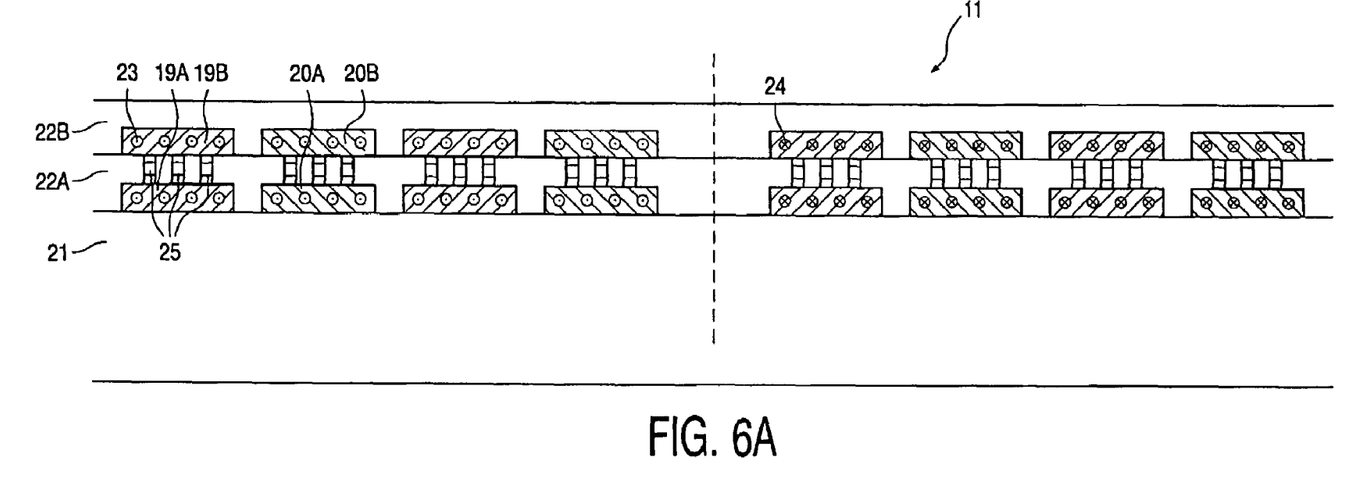
FIG. 6A is a diagrammatic cross-sectional view of a further embodiment of the planar inductive component in accordance with the invention.

FIG. 6A is a diagrammatic cross-sectional view of a further embodiment of the planar inductive component 11 in accordance with the invention. This embodiment is comparable to the embodiment shown in FIG. 5A. As in the embodiment shown in FIG. 5A, concentric, interlaced planar inductors comprise a first spiral pattern 19A, 20A and a second spiral pattern 19B, 20B.

The outstanding difference relative to the embodiment shown in FIG. 5A resides in that the first spiral pattern 19A, 20A is electroconductively connected to the second spiral pattern 19B, 20B by means of vias 25. By electroconductively connecting the first spiral pattern 19A, 20A to the second spiral pattern 19B, 20B, it is achieved that the effective cross-section of the two concentric, interlaced planar inductors is increased. This has the advantage that a smaller series resistance is achieved in combination with an unchanged self-inductance. A reduction of the series resistance achieved in this manner is important because in the standard technologies that can be used to realize planar inductive components in accordance with the invention, the thickness of electroconductive layers is predetermined, while these technologies generally do afford the possibility of stacking a plurality of electroconductive layers in such a way that they are electrically insulated from each other. These conductive layers can then be interconnected by means of vias in an electrically conducting manner.

Figure 6B:
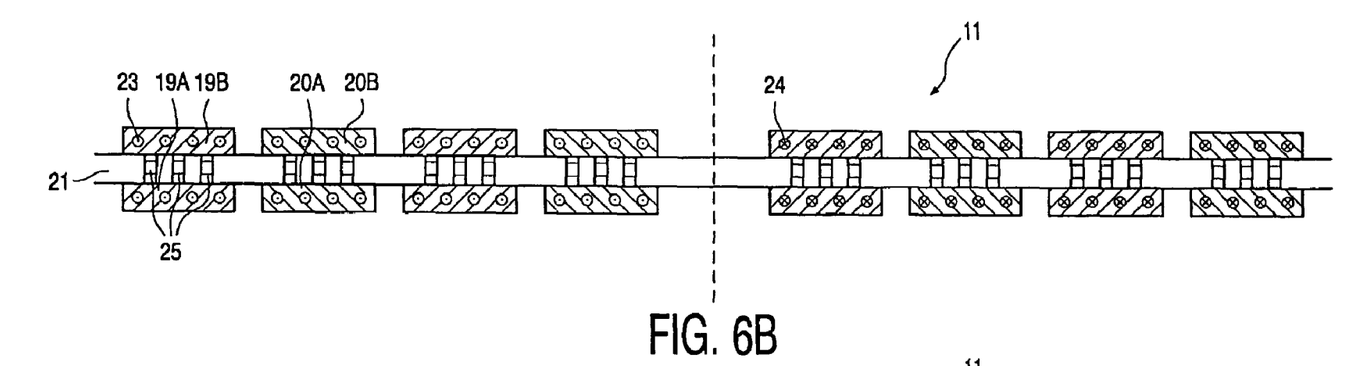
FIG. 6B is a diagrammatic cross-sectional view of a further embodiment of the planar inductive component in accordance with the invention.

FIG. 6B is a diagrammatic cross-sectional view of a further embodiment of the planar inductive component 11 in accordance with the invention. This embodiment is comparable to the embodiment shown in FIG. 6A. As in the embodiment shown in FIG. 6A, the concentric, interlaced planar inductors comprise the first spiral pattern 19A, 20A and the second spiral pattern 19B, 20B. This embodiment is particularly suitable for use in thin-film or thick-film technologies with, for example, a ceramic substrate on either side of which electroconductive thin-film materials or thick-film materials are provided. This embodiment is also excellently suited for use on printed circuit boards on either side of which electroconductive layers of, for example, copper are provided. The difference relative to the embodiment shown in FIG. 6A resides in that the substrate 21 does not only serve as a support but also as an electrically insulating layer.

Figure 6C:
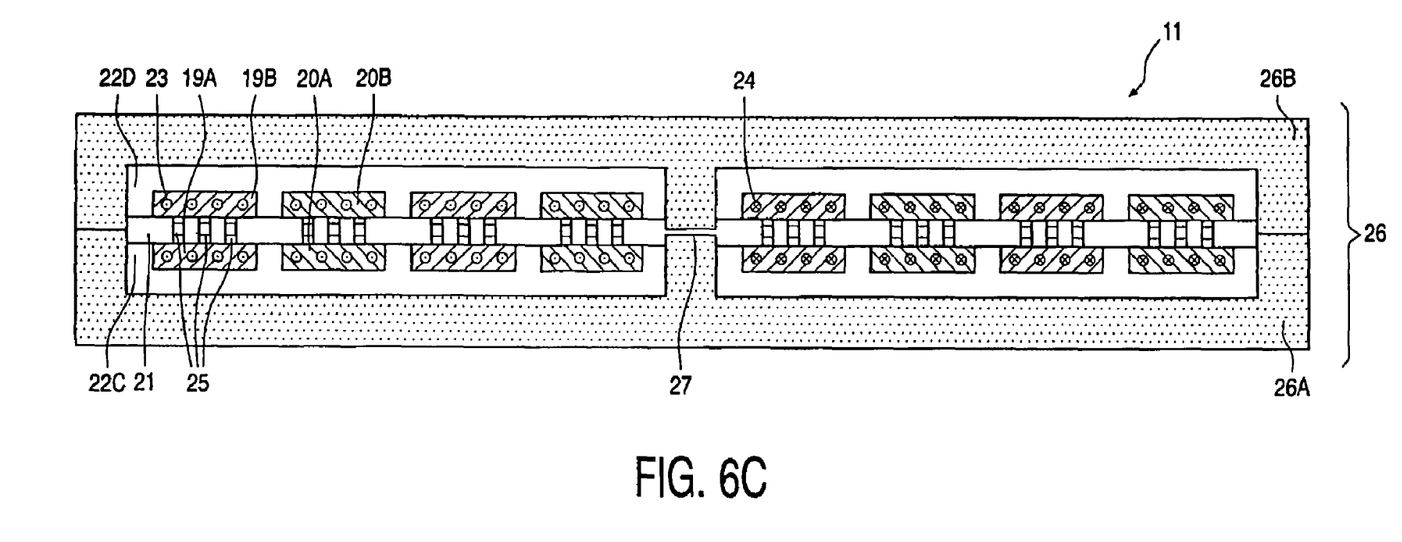
FIG. 6C is a diagrammatic cross-sectional view of a further embodiment of the planar inductive component in accordance with the invention.

FIG. 6C is a diagrammatic cross-sectional view of a further embodiment of the planar inductive component 11 in accordance with the invention. This embodiment is comparable to the embodiment shown in FIG. 6B. The outstanding difference is that the planar inductive component is provided with an envelope 26 of magnetic material. The envelope 26 comprises a first part 26A and a second part 26B. In cases where the technology used enables an envelope of magnetic material to be applied, said envelope has the advantage that the planar inductive component 11 has improved magnetic properties. In practice, this leads to a higher quality factor Q. For practical reasons, for example to increase the reproducibility in mass-production, it may be useful to provide a small, well-defined air gap 27 between the first part 26A and the second part 26B.

Figure 7:
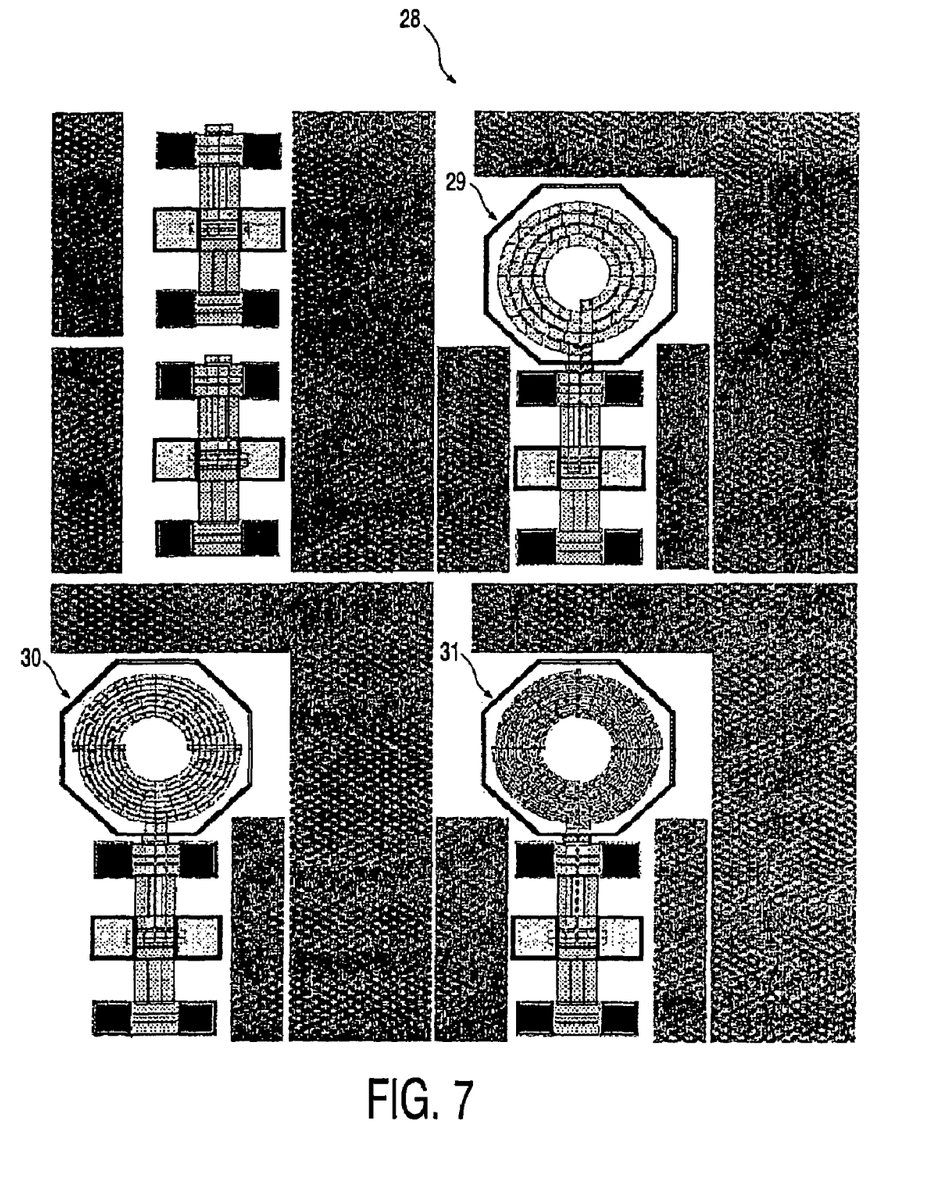
FIG. 7 shows a part of a design of an integrated circuit comprising three planar inductors, including two embodiments of the planar inductive component in accordance with the invention.

FIG. 7 shows a part of a design 28 of an integrated circuit comprising three embodiments of planar inductors, including two embodiments of the planar inductive component in accordance with the invention. The design 28 comprises an embodiment 29 of a planar inductor in accordance with the state of the art, an embodiment 30 of the planar inductive component in accordance with the invention with two concentric, interlaced spiral patterns, and an embodiment 31 of the planar inductive component in accordance with the invention with four concentric, interlaced spiral patterns. In other respects, the three embodiments 29, 30, 31 in the design are designed so as to be as identical as possible. The design 28 offers a manner of comparing the improved behavior at high frequencies of the planar inductive components 30 and 31 in accordance with the invention with the behavior at high frequencies of the planar inductor 29 in accordance with the state of the art.

Figure 8:
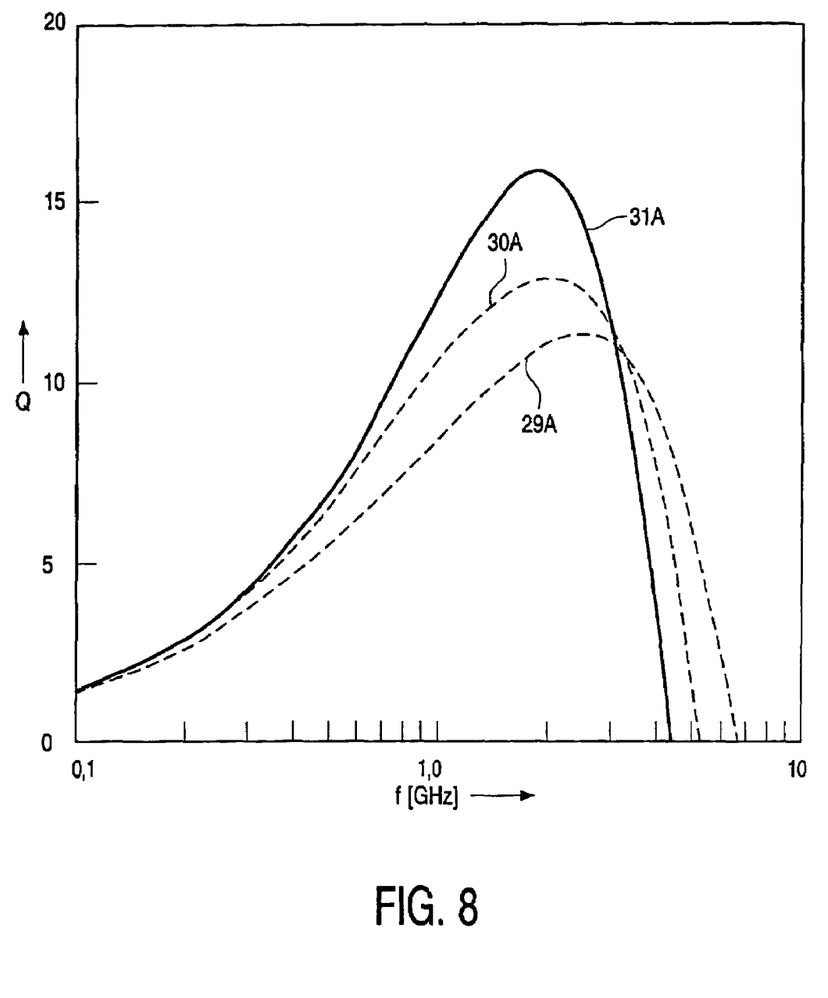
FIG. 8 shows the measured quality factors as a function of the frequency of the planar inductors shown in FIG. 7.

FIG. 8 shows the measured quality factors as a function of the frequency of the planar inductors shown in FIG. 7. Curve 29A shows the measured quality factor Q as a function of the frequency of the embodiment 29 of a planar inductor in accordance with the state of the art. The maximum value of curve 29A is 11.3. Curve 30A shows the measured Q as a function of the frequency of the embodiment 30 of the planar inductive component in accordance with the invention. The maximum value of curve 30A is 12.8. Curve 31A shows the measured Q as a function of the frequency of the embodiment 31 of the planar inductive component in accordance with the invention. The maximum value of curve 31A is 15.8.

The measured improvement of $Q_{max}$ is slightly below the calculated improvement of $Q_{max}$. In the design 28, the distance between the electroconductive material of a spiral pattern or two interlaced spiral patterns is not the same for the embodiments 29, 30 and 31. For the embodiment 29 of a planar inductor in accordance with the state of the art, this distance is larger than for embodiment 30 of the planar inductive component in accordance with the invention comprising two concentric, interlaced spiral patterns, while for said embodiment the distance is larger than for embodiment 31 of the planar inductive component in accordance with the invention comprising four concentric, interlaced spiral patterns. The smaller said distance, the larger the parasitic capacitance between the turns is. The increase in said parasitic capacitance causes the measured improvement in $Q_{max}$ to be slightly below the calculated improvement in $Q_{max}$.

Figure 9A:
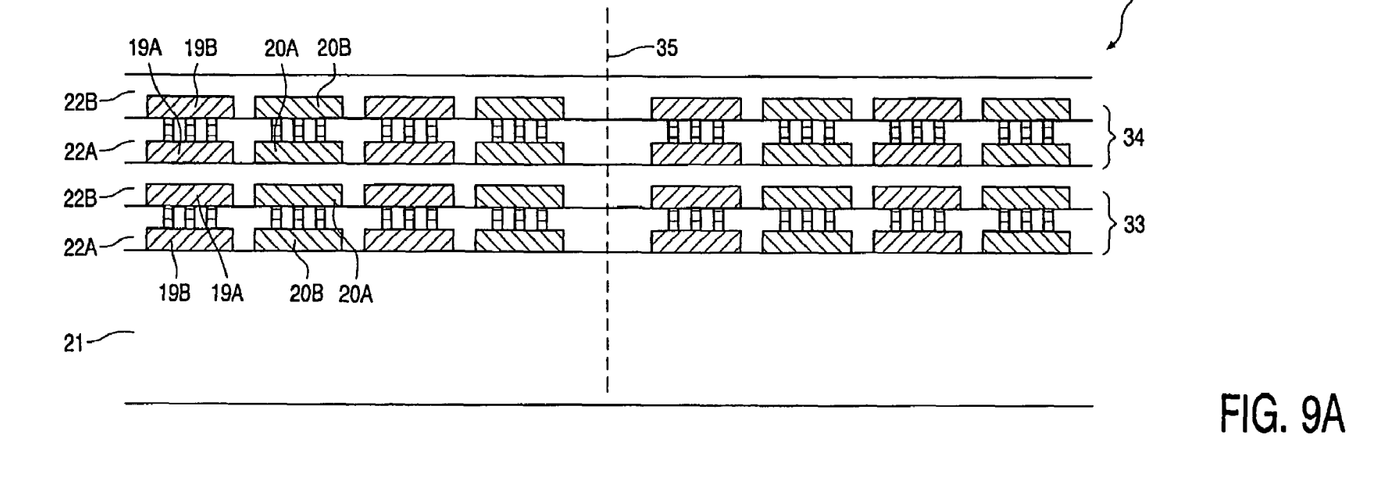
FIG. 9A is a diagrammatic cross-sectional view of an embodiment of a planar transformer in accordance with the invention.

FIG. 9A is a diagrammatic cross-sectional view of an embodiment of a planar transformer 32 in accordance with the invention. This embodiment comprises a first planar inductive component 33 in accordance with the invention and a second planar inductive component 34 in accordance with the invention. The main faces of the first and the second planar inductive component 33 and 34 extend parallel to each other. The imaginary centers of the first and the second planar inductive component 33 and 34 are situated on an axis 35 that extends perpendicularly to both main faces. The first planar inductive component 33 is provided on the substrate 21. The first and the second planar inductive component 33 and 34 are separated from each other by one of the insulating layers 22B. Apart from the above-mentioned differences in construction, both planar inductive components are built up in the same manner as the inductive component shown in FIG. 6A. The first planar inductive component 33 forms a first winding of the transformer 32. The second inductive planar component 34 forms a second winding of the transformer 32.

By positioning the first and the second planar inductive component 33 and 34 relative to each other, it is achieved that the mutual magnetic coupling is maximized. An advantage of the planar transformer realized in this manner is that at the first winding and at the second winding, the current is equally distributed over the spiral patterns of the first planar inductive component 33 and also uniformly distributed over the spiral patterns of the second planar inductive component 34. As explained hereinabove, this homogenized current distribution results in low ohmic losses at high frequencies. Therefore, the planar transformer 32 is excellently suited for operation at high frequencies.

Figure 9B:
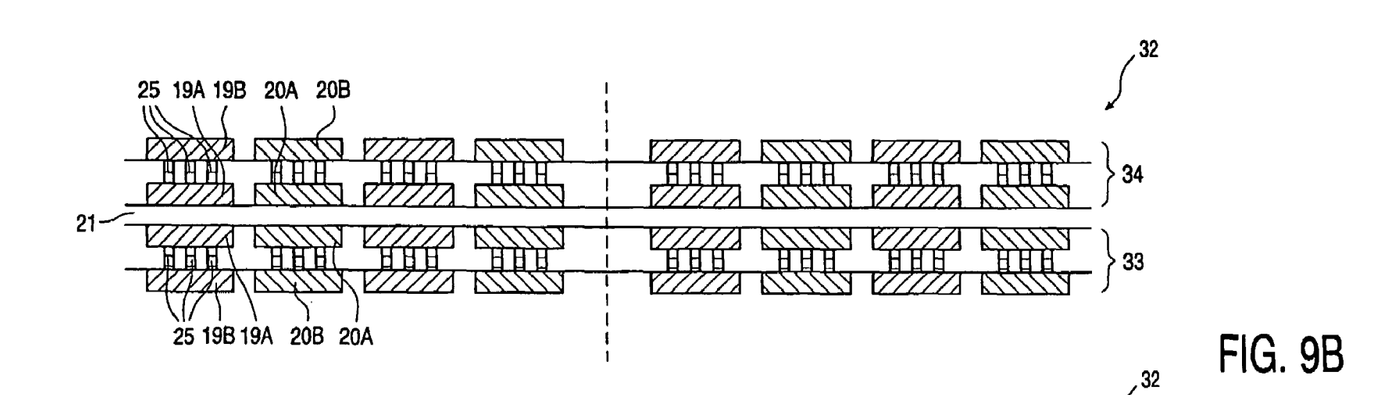
FIG. 9B is a diagrammatic cross-sectional view of a further embodiment of a planar transformer in accordance with the invention.

FIG. 9B is a diagrammatic cross-sectional view of a further embodiment of the planar transformer 32 in accordance with the invention. This embodiment is comparable to the embodiment shown in FIG. 9A. It differs from the embodiment shown in FIG. 9A in that the substrate 21, which extends parallel to the main faces of the first and the second planar inductive component 33 and 34, is situated between the first and the second inductive component and hence does not only serve as a support but also as an electrically insulating layer. The embodiment shown in FIG. 9A is particularly suitable for application in integrated circuits, while the embodiment shown in FIG. 9B is particularly suitable for application, for example, in the field of switch-mode power supplies. In the frequency range associated with switch-mode power supplies, it is favorable to realize such planar transformers using thin-film or thick-film technologies with, for example, a ceramic substrate 21 on either side of which electroconductive thin-film or thick-film materials are provided. This embodiment is also excellently suited for use on printed circuit boards on either side of which electroconductive layers of, for example, copper are provided.

Figure 9C:
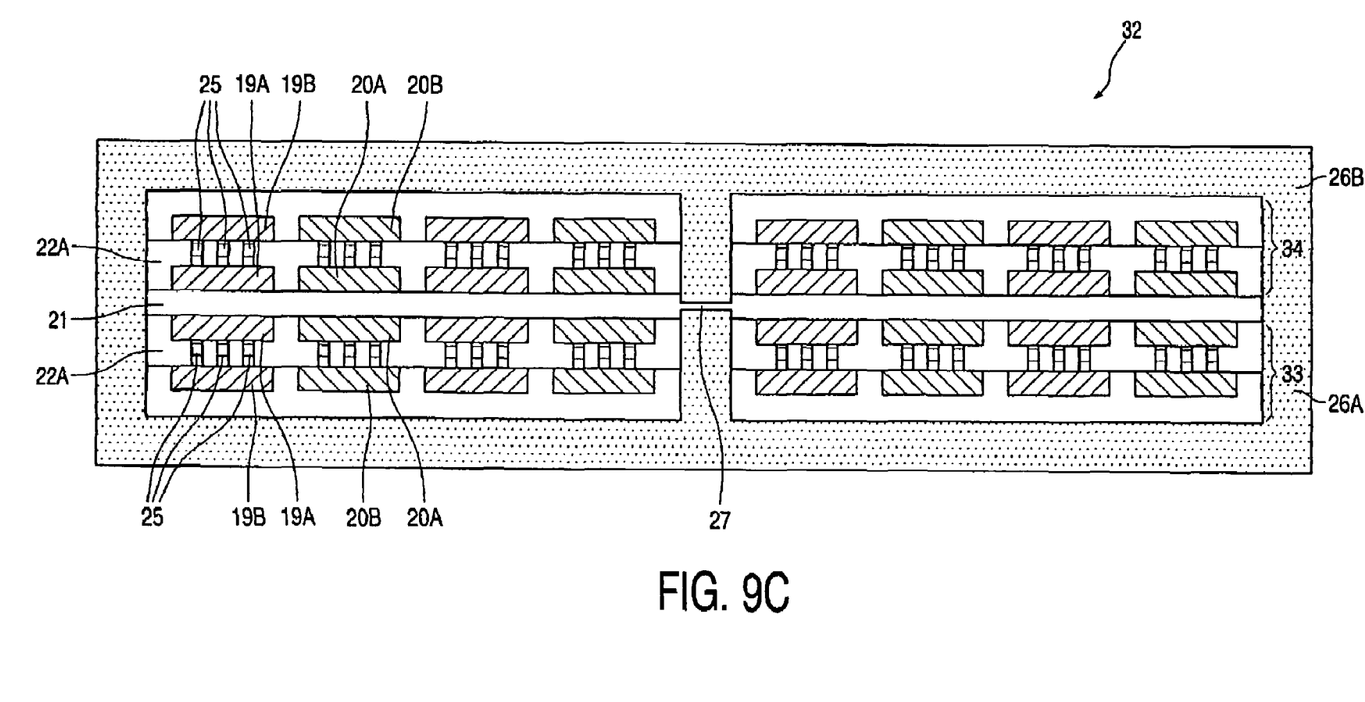
FIG. 9C is a diagrammatic cross-sectional view of a further embodiment of a planar transformer in accordance with the invention.

FIG. 9C is a diagrammatic cross-sectional view of a further embodiment of the planar transformer 32 in accordance with the invention. This embodiment is comparable to the embodiment shown in FIG. 9B. The outstanding difference relative to the embodiment of FIG. 9B resides in that the planar transformer is provided with an envelope 26 of a magnetic material. The envelope comprises a first part 26A and a second part 26B. In applications where it is compatible with the technology used, the use of the envelope of magnetic material has the advantage of improved magnetic coupling between the first winding formed by the first inductive component 33 and the second winding formed by the inductive component 34. For practical reasons, for example to reduce the reproducibility in mass production, it may be useful to provide a small, well-defined air gap 27 between the first part 26A and the second part 26B.

The invention claimed is:

1. A planar inductive component comprising:
   at least a first and a second concentric planar inductor, which include, respectively, a first electroconductive circular spiral pattern and a second electroconductive circular spiral pattern, the first electroconductive circular spiral pattern having a first end point and a second end point, and the second electroconductive circular spiral pattern having a first end point and a second end point, characterized in that
   the first electroconductive circular spiral pattern that belongs to the first concentric inductor, and the second electroconductive circular spiral pattern that belongs to the second concentric inductor are interlaced and are respectively patterned in a radius that increases from an inner end to an outer end;
   the first end point and the second end point of the first electroconductive circular spiral pattern are electroconductively interconnected, and the first electroconductive circular spiral pattern is interrupted at the outside by a narrow slit so as to form a first electroconductive contact and a second electroconductive contact on either side of the interruption;
   the first end point and the second end point of the second electroconductive circular spiral pattern are electroconductively interconnected, and the second electroconductive circular spiral pattern is interrupted at the outside by a narrow slit so as to form a first electroconductive contact and a second electroconductive contact on either side of the interruption.

2. A planar inductive component as claimed in claim 1, characterized in that the planar inductors each comprise at least a first electroconductive spiral pattern and a second electroconductive spiral pattern that are separated from each other by an electrically insulating layer and that form a spiral pattern that is asymmetrical about a center point of the inductive component.

3. A planar inductive component as claimed in claim 1, characterized in that the first electroconductive contact of the first electroconductive spiral pattern is electroconductively connected to the first electroconductive contact of the second electroconductive spiral pattern, and the second electroconductive contact of the first electroconductive spiral pattern is electroconductively connected to the second electroconductive contact of the second electroconductive spiral pattern so as to form a system of electrically interconnected inductors having identical electrical and magnetic properties.

4. A planar transformer comprising a first planar inductive component and a second planar inductive component as claimed in claim 1, wherein the first planar inductive component and the second planar inductive component are separated by means of an electrically insulating layer, and wherein the first planar inductive component forms a first winding of the planar transformer and the second planar inductive component forms a second winding of the planar transformer.

5. The planar inductive component of claim 1, wherein the first concentric planar inductor is connected in parallel to the second concentric planar inductor.

6. The planar inductive component of claim 1, wherein the first and second endpoints of the first concentric inductor are coplanar and respectively located at inner and outer portions of the first concentric inductor and are connected by an electrical conductor extending over concentric spiral windings of the inductor.

7. A planar inductive component as claimed in claim 1, characterized in that the first end point and the second end point of at least one of the electroconductive circular spiral patterns are respectively located at innermost and outermost portions of the circular spiral pattern, the narrow slit being in an outermost portion of the circular pattern that is separated from and between the first and second end points, the first and second end points being connected by an interconnect that extends across the spiral pattern from the innermost end point to the outermost end point.

8. A planar inductive arrangement comprising:
   first and second concentric and coplanar interlaced spiral inductors, each spiral inductor having
      a spiral conductor extending spirally from a centermost end to an outermost end via an increasing radius, and
      contacts on opposing sides of a slit interruption at an outside portion of an outermost spiral of the conductor, the slit interruption interrupting the contiguity of the outermost spiral; and
   for each inductor, an electrical interconnect that connects the centermost end to the outermost end.

9. The arrangement of claim 8, wherein the first and second concentric and coplanar interlaced spiral inductors are interlaced such that the spiral conductors alternate between a spiral conductor of the first inductor and a spiral conductor of the second inductor when moving, in the plane of the inductors, from an innermost spiral of the concentric spirals to an outermost spiral of the concentric spirals.

10. The arrangement of claim 8, wherein the first and second concentric and coplanar interlaced spiral inductors are laterally separated by an insulator and form a contiguous planar region extending from the centermost end of the conductors to the outermost end of the conductors.

11. The arrangement of claim 8, wherein the spirals in each inductor have a surface that is coplanar with surfaces of the other spirals in the arrangement, and wherein the spirals have an axis that is about perpendicular to the coplanar surfaces.

12. The arrangement of claim 8, wherein the concentric and coplanar interlaced spiral inductors have electrical and magnetic properties that are about identical to one another.

13. The arrangement of claim 8, wherein the concentric and coplanar interlaced spiral inductors are connected in parallel.

14. A planar inductive component comprising:
   at least a first and a second concentric planar inductor, which include, respectively, a first electroconductive circular spiral pattern and a second electroconductive circular spiral pattern that have an increasing radius, are interlaced, electroconductively interconnected by vias and separated from each other by an electrically insulating layer, the first electroconductive circular spiral pattern having a first end point and a second end point, and the second electroconductive circular spiral pattern having a first end point and a second end point, the first end point and the second end point of the first electroconductive circular spiral pattern being electroconductively interconnected, and the first electroconductive circular spiral pattern being interrupted at the outside by a narrow slit so as to form a first electroconductive contact and a second electro conductive contact on either side of the interruption, and the first end point and the second end point of the second electroconductive circular spiral pattern being electroconductively interconnected, and the second electroconductive circular spiral pattern being interrupted at the outside by a narrow slit so as to form a first electroconductive contact and a second electroconductive contact on either side of the interruption.

15. A planar inductive component of claim 14, wherein the first end point and the second end point of at least one of the electroconductive circular spiral patterns are respectively located at innermost and outermost portions of the circular spiral pattern, the narrow slit being in an outermost portion of the circular pattern that is separated from and between the first and second end points, the first and second end points being connected by an interconnect that extends across the spiral pattern from the innermost end point to the outermost end point.

* * * * *